United States Patent [19]

Despiney

[11] 4,327,390
[45] Apr. 27, 1982

[54] CAPACITIVE VOLTAGE TRANSFORMERS WITH ELECTRONIC OUTPUT

[75] Inventor: Philippe Despiney, le Perreux, France

[73] Assignee: Enertec, Montrouge, France

[21] Appl. No.: 144,466

[22] Filed: Apr. 28, 1980

[30] Foreign Application Priority Data

May 9, 1979 [FR] France ............................ 79 11690

[51] Int. Cl.³ .......................................... H02H 7/16
[52] U.S. Cl. ................................... 361/16; 324/126
[58] Field of Search ................................ 361/15–17; 324/126

[56] References Cited

U.S. PATENT DOCUMENTS 3,870,926 3/1975 Hughes ................................ 361/16
4,196,388 4/1980 Weller et al. .................... 324/126 X

FOREIGN PATENT DOCUMENTS 2634595 3/1977 Fed. Rep. of Germany .

Primary Examiner—Harry E. Moose, Jr.
Attorney, Agent, or Firm—Dale V. Gaudier; Mikio Ishimaru

[57] ABSTRACT

A capacitive voltage transformer of the type having voltage divider capacitors and an electronic amplifier connected to one of the divider capacitors includes circuitry for isolating the voltage divider capacitors in the event that primary power to the voltage divider is interrupted. The circuitry measures and compares the voltage at a terminal of one of the divider capacitors and the current through the divider. If primary power to the voltage divider is interrupted, the capacitor voltage remains high while the divider current goes to zero, and the circuitry acts to isolate (such as through relay controlled switches) the divider capacitors from the electronic amplifier. This prevents any distortion from appearing in the voltages across the divider capacitors and prevents transients from developing at the input to the electronic amplifier.

11 Claims, 4 Drawing Figures

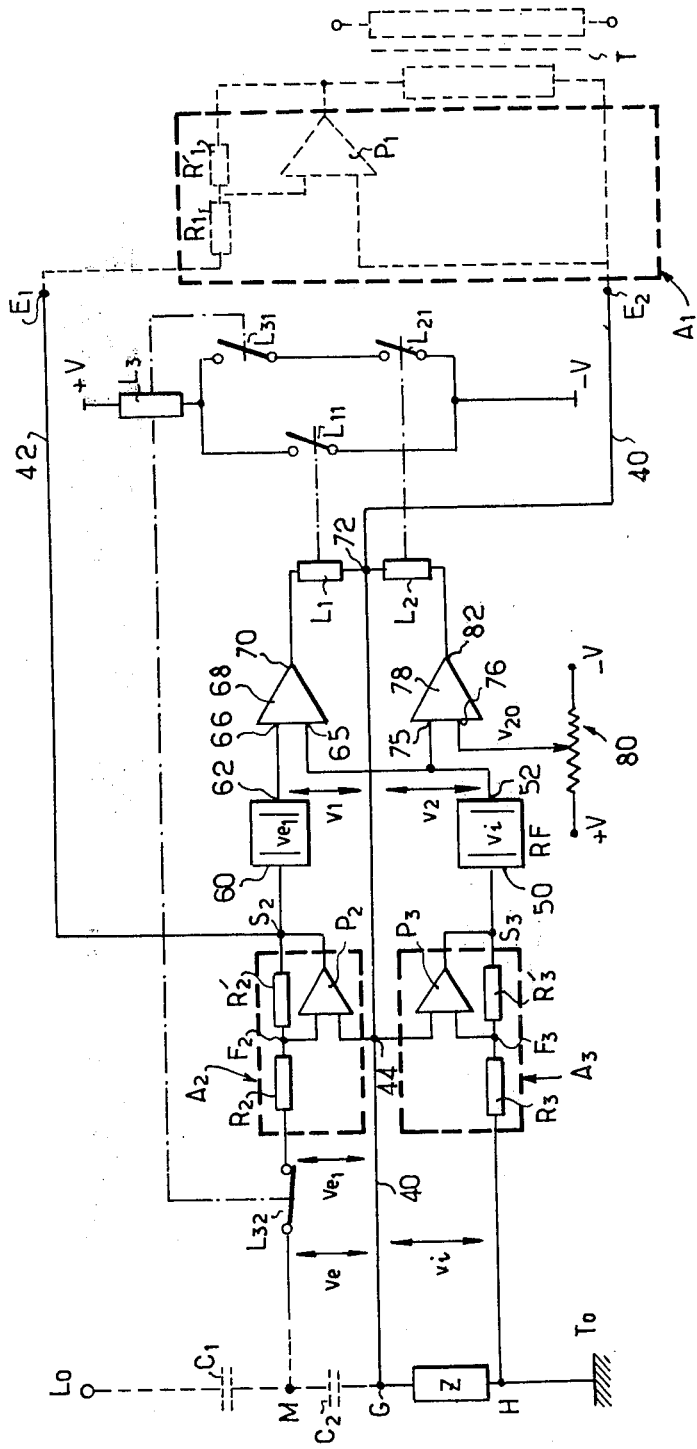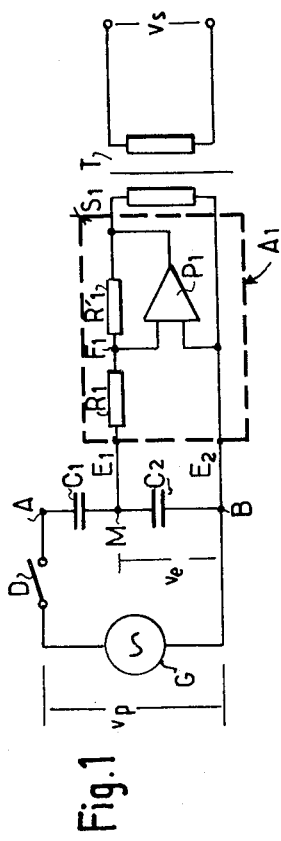
Fig. 1
Fig. 2

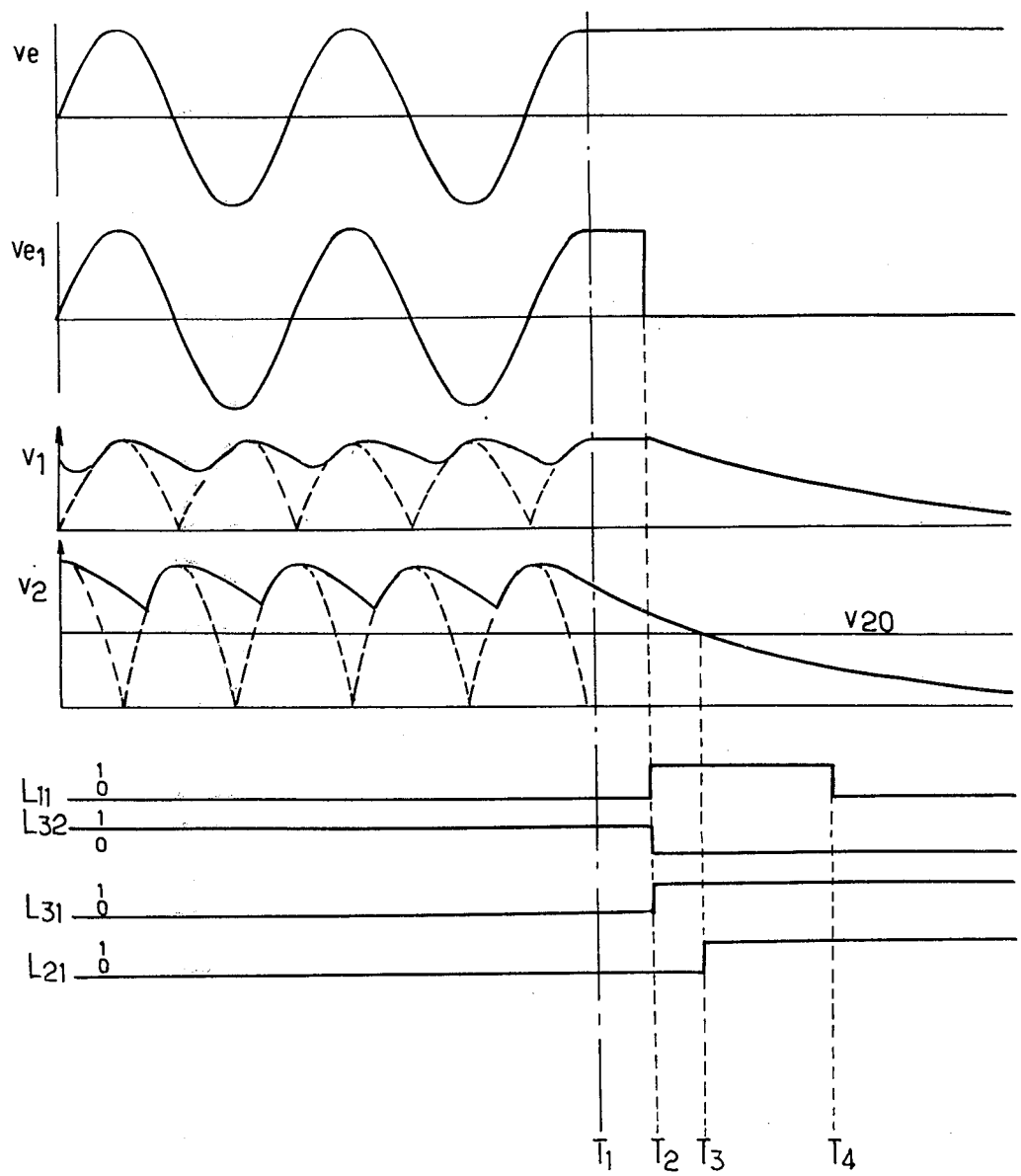

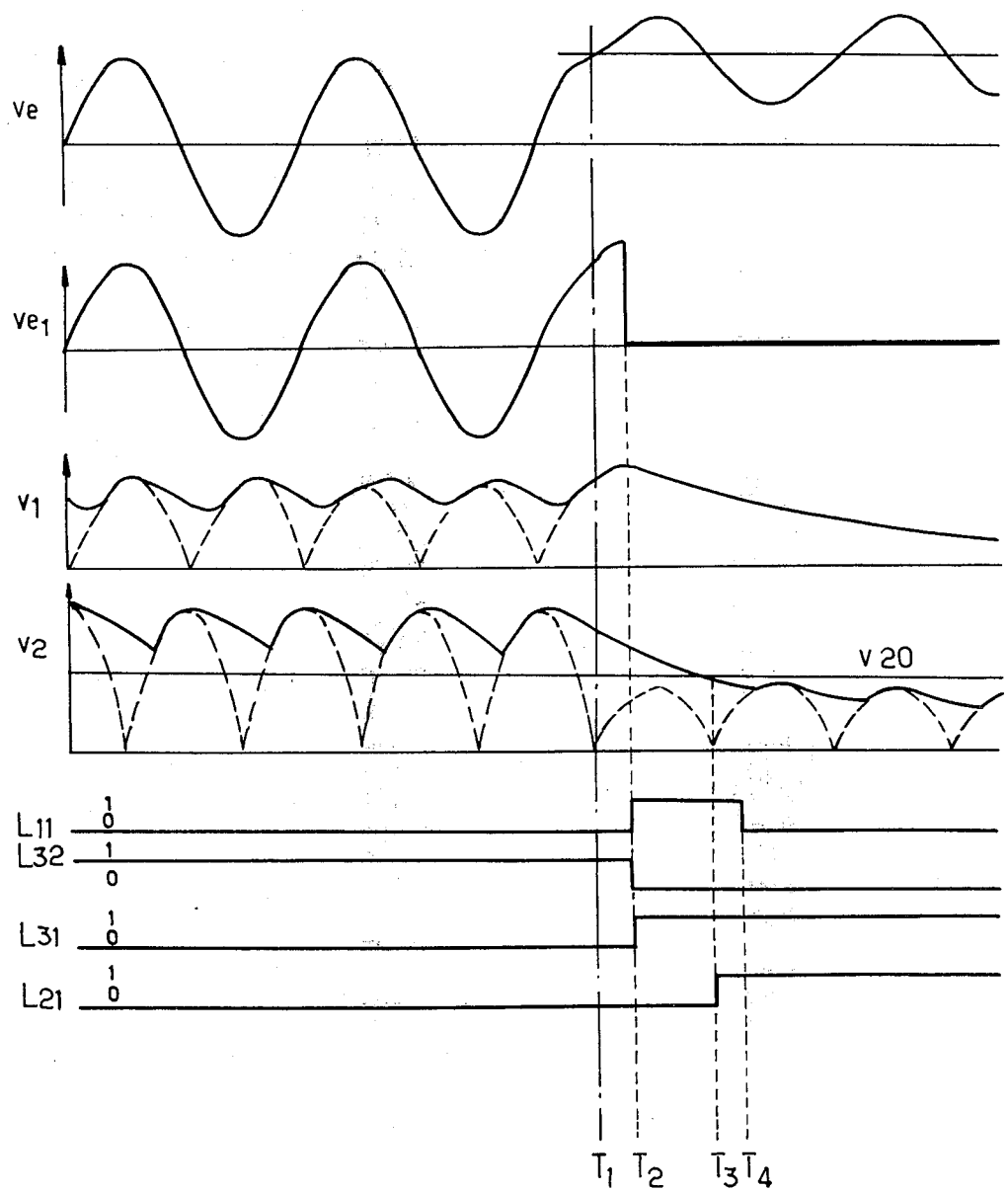

CAPACITIVE VOLTAGE TRANSFORMERS WITH ELECTRONIC OUTPUT

The present invention concerns capacitive voltage dividers and more particularly dividers wherein the output voltage is received by an electronic amplifier capable of providing an output to an inductive load. In a capacitive divider, two capacitors C1 and C2 are connected in series between a first and a second terminal, between which there is applied an alternating supply voltage, referred to as the primary voltage. The second terminal is generally held at a reference potential, for example earth.

The voltage at the terminals of the second capacitor C2, referred to as the secondary voltage, represents a fraction of the primary voltage, with the ratios between the capacitors C1 and C2 defining the division ratio as between the primary and secondary voltages. This type of divider is put to particularly valuable use in transformers for measuring very high voltages. In fact, it makes it possible to measure very high voltages at the primary by taking off the secondary voltage, without having recourse to magnetic transformers which are capable of withstanding such high voltages, with corresponding isolating means. In many known capacitive voltage transformers (CVT) of this type, the secondary voltage which is taken off at the terminals of the capacitor C2 is used to supply the primary of an induction-type transformer which provides an additional reduction in the voltage. It has been proposed that this manner of taking off the secondary voltage should be replaced by taking off voltage by means of a purely electronic amplifier whose output supplies a magnetic transformer which is intended to provide for galvanic isolation as between the CVT and means for utilising the measurement downstream of the amplifier. This solution which moreover enjoys a certain number of advantages and which can be used not only to replace the CVT with an induction type transformer but which can also be used on transformers of this type for taking off a second signal representative of the primary voltage, nonetheless suffers from a serious disadvantage when the alternating supply voltage is abruptly cut off.

Indeed, if the interruption in the supply voltage occurs at the moment that the amplitude of the voltage is at a high value in absolute terms (in particular in the vicinity of the peak value), the capacitors of the divider are charged at the moment that the voltage is disconnected.

The presence of such charges in the capacitors of the divider and in particular in capacitor C2 gives rise to certain problems when the supply voltage for the transformer or the capacitive divider is re-established.

Indeed, it should not be forgotten that if, for example, the capacitive divider is part of a capacitive voltage transformer connected between a high voltage line and earth, disconnection thereof at its two ends eliminates any possibility of the charges in the capacitors C1 and C2 escaping. In fact, it is found that, when disconnections are of long duration, the capacitors and in particular the capacitor C1 may remain charged for extremely long periods, with only extremely low leakage currents permitting the charges to escape.

As regards the capacitor C2, at the terminals of which the secondary voltage is taken off, the interruption in the supply voltage may result, according to circumstances, in two types of effects which are harmful insofar as they give rise to transitory phenomena when the supply voltage is restored. According to circumstances, the transitory phenomena may originate from a lack of balance as between the charge states of capacitors C1 and C2 at the moment at which the voltage is restored, or saturation of the magnetic transformer at the output of the electronic amplifier, under the effect of the continuous (very high) voltage which was present at the output of the amplifier when the supply voltage was interrupted, leaving the capacitor C2 charged. Indeed, in this case, the input voltage of the electronic amplifier is maintained continuously at a maximum value.

The present invention seeks to remedy the above-indicated disadvantages, in particular by limiting the effects of the charges which are trapped in a capacitive voltage divider to which the alternating supply has been interrupted, on the behaviour of the divider when the voltage is restored.

In accordance with one aspect of the invention, there is provided a voltage detection means for a capacitive voltage divider which comprises a first and a second capacitor in series intended to be connected between a high voltage line and a means at reference potential, for the purposes of supplying an inductive load, comprising:

means for making a high-impedance connection between two points of the capacitive divider, on respective sides of said second capacitor, and said inductive load, to supply to said load a signal which depends on the voltage at the terminals of the second capacitor;

means for producing a current signal depending on the current passing through the capacitive divider;

means for forming a control signal depending on said current signal and a voltage at the terminals of a capacitive portion of said divider; and means for modifying said high-impedance connection in response to said control signal when a predetermined relationship is established between said current and said voltage.

In accordance with another aspect of the invention, there is also provided a means for taking off voltage on a capacitive divider which comprises a first and a second capacitor intended to be connected in series between a terminal which is under voltage and a means at reference potential, for the purposes of supplying an output load, comprising:

means for making a high-impedance connection between two points of the divider on respective sides of the second capacitor, on the one hand, and said load, on the other hand, in order to supply to said load a signal depending on the voltage at the terminals of the second capacitor;

means for detecting the disappearance of the alternating component of the supply voltage for said capacitive divider; and means for interrupting said high impedance connection in response to detection by said detection means of the disappearance of the alternating component of the supply voltage of the capacitive divider.

Other aspects and advantages of the invention will be apparent from the following description with reference to the accompanying drawings in which:

FIG. 1 shows a capacitive voltage divider with which an amplifier is associated, FIG. 2 shows a circuit using the principles of the invention for a capacitive voltage divider of the type used as a capacitive voltage transformer for measuring high voltages, and FIGS. 3 and 4 are wave form diagrams showing the mode of operation of the apparatus of FIG. 2, in two types of transformer supply situations.

FIG. 1 shows a capacitive voltage divider comprising two capacitors C1 and C2 connected in series between two terminals A and B. An alternating voltage generator, for example for producing a voltage at a frequency of 50 Hz, is capable of supplying a voltage $v_p$ between the terminals A to B when a circuit breaker switch D is in the closed position.

Each of the capacitors C1 and C2 has a plate connected to a common junction terminal M. Connected between the terminals M and B is an electronic amplifier means A1 for taking off the secondary voltage $v_e$ (voltage at the terminals of the capacitor C2). The ratio between the amplitude of the voltage $v_e$ and the voltage $v_p$ is determined by the values of the capacitors C1 and C2. It remains constant for the instantaneous values of $v_p$ and $v_e$ and independent of the nature, alternating or aperiodic, of the voltage $v_p$ if the input impedance of the electronic means A1 connected to the terminals M and B is sufficiently high.

The electronic amplifier A1 conventionally comprises an input resistor R1 having one end connected to the terminal M, an operational amplifier P1 disposed in respect of input between the terminal B and the other end F1 of the resistor R1, and a negative feedback resistor R'1. The output S1 of the amplifier P1 feeds a magnetic voltage transformer T to provide an output voltage $v_s$ for user means which are thus galvanically isolated from the actual capacitive divider.

In the normal period of use of the capacitive divider C1 and C2, the switch D is closed and opening thereof causes the supply voltage to the capacitive divider to be interrupted. It is possible for opening of the switch to occur at the moment that the amplitude of the alternating supply voltage reached a relatively high value, and in particular was in the vicinity of its peak value.

In this situation, each of the two capacitors C1 and C2 is charged to a high value respectively determined by its voltage at the terminals when the alternating supply between points A and B is interrupted. When the switch D remains in the open condition, the capacitor C1 can discharge only by way of leakage currents with a time constant which may be considerable.

As regards the capacitor C2, this discharges into the input impedance of the amplifier A1 in accordance with an exponential law whose time constant is Te, being imposed by the values in respect of the capacitance of C2 and the resistance of resistor R1, such that $Te = R1 \times C2$.

If Te is first assumed to be low, the voltage at the terminals of the capacitor is going to fall and the transformer T will be supplied by a corresponding voltage at the output of the amplifier A1. If the transformer is of sufficient size and the voltage at the terminals of C2 falls sufficiently quickly, the transformer will be able to withstand the aperiodic voltage appearing at its terminals, without damage.

It should be noted however that this situation, involving a relatively low time constant in respect of discharge of C2 through A1 corresponds to the amplifier A1 also having a low input impedance. Under these circumstances, the voltage $v_e$ at the terminals of C2 is out of phase under continuous operating conditions with respect to the primary voltage $v_p$ during continuous operating conditions in respect of supply to the capacitive divider.

In the event of a defect occuring in the primary voltage, there is the danger that the voltage $v_e$ will no longer form a faithful image of the primary voltage, with a transitory condition appearing between M and B, for example in the event of a short-circuit between A and B. In this case, the variation in the output signal of the electronic amplifier A1 does not instantly follow that in the primary voltage. Hence, the attraction of a high input impedance in A1 when the divider is used for monitoring the primary voltage and in particular for detecting abrupt variations therein.

In addition, while still assuming the situation wherein the time constant Te is low, it is found that the capacitor C1 can discharge in a relatively short time with respect to the discharge time of the capacitor C1. This results in a lack of equilibrium as between the charge levels for the two capacitors and the primary voltage/secondary voltage division ratio will no longer be respected when the switch D is closed again, that is to say, when the supply voltage is restored at the terminals of the capacitive divider C1 and C2. This will therefore result in a transitory operating situation in respect of the output voltage $v_s$ when the switch D is closed again. This can also prejucice satisfactory operation of the divider and its electronic output circuit since, for a period of time following restoration of the normal divider supply voltage, the output of the divider will not be a precise reflection of its input.

Simply increasing the time constant in respect of discharge of capacitor C2 through A1 gives rise to other problems which can also prejudice satisfactory operation of the divider. In fact, if it is assumed that the time constant Te is high and, if not equal to the time constant of C1, at least long with respect to the normal period for which the switch D is open, it will be clear that, for the whole period that the switch D is open, the amplifier A1 will then saturate the transformer T.

When voltage is re-applied to the capacitive divider C1 and C2, the saturation of the transformer will falsify the output signal $v_s$ throughout the period required for the magnetic circuit of the transformer T to resume its normal state. A transitory condition of this kind at the moment that the switch D is re-closed is undesirable, in respect of the situation arising at the output $v_s$ of the apparatus.

It will be appreciated that added to this transitory condition will also be the transitory condition due to the difference between the levels of charge in capacitors C1 and C2 at the moment that the voltage is re-applied. As has been seen hereinbefore, partial discharge of C2 results in a lack of equilibrium in respect of the charges at the capacitors C1 and C2, which results in the appearance of an aperiodic at the moment that voltage is re-applied.

While still using an amplifier A1 with a high input impedance, it would be possible to envisage detecting the interruption in the primary voltage for connecting a discharge resistor in parallel to C2 in order to permit rapid discharge of C2 without the output voltage of A1 saturating the transformer T. However, this construction does not make it possible to overcome the problem of lack of balance as between the charges on C1 and C2 at the moment of re-applying the voltage. For that purpose, it would be necessary for a discharge resistor also to be connected to the terminals of C1, which is not a practical solution when the capacitive divider in question is part of a capacitive voltage transformer for high voltage lines, when the voltage at the terminals of C1 can reach several hundreds of thousands of volts.

A solution which can be envisaged in order to avoid saturation of the transformer T, under the effect of the charges trapped in the capacitor C2 when the supply voltage is interrupted at a high amplitude level, would consist of positioning a high-pass filter at the input of the amplifier A1 in order to avoid the continuous component of the voltage at the terminals of C2 being applied to the amplifier. However, a filter of this kind results in a phase difference between the voltage detected at the terminals of capacitor C2 and the output of the amplifier A1, which is prejudicial to the primary voltage being faithfully represented by the output voltage of the transformer.

In addition, a filter of this kind, in itself, is the source of transitory conditions when the continuous operating condition disappears or re-appears, and this is not compatible with the above-indicated requirements in regard to accuracy and fidelity of the desired apparatus.

The difficulties which have just been set out above in regard to various previously proposed designs, for dealing with the problem of the charges which are trapped in capacitive dividers when the supply thereto is interrupted, may be overcome if the connection between the capacitor C2 and the transformer T is broken as soon as the interruption in the supply occurs. The disappearance of the supply to the capacitive divider should then be detected in order to provide for the above-mentionned disconnection effect, within periods of time which are sufficiently short to prevent saturation of the transformer T and to minimise discharge of the capacitor C2.

Reference will now be made to FIG. 2 which shows a voltage capacitive transformer which is connected between a point Lo of a high voltage line and earth To and which comprises a capacitive divider formed by capacitors C1 and C2 in series between points Lo and To. The capacitive voltage transformers (CVT) are well known and the present description does not require detailed description of the structure thereof.

The voltage at the terminals of C2 is detected by an electronic amplifier A1 which is identical to that shown in FIG. 1. FIG. 2 uses the same reference as those used in FIG. 1 for the capacitors C1 and C2 on the one hand, with their common point M, the amplifier A1 with its components and the magnetic output transformer T, on the other hand. The amplifier A1 comprises two inputs E1 and E2 which are connected to the terminals of the capacitor C1 in a manner which will be described in greater detail hereinafter.

Disposed in series between the capacitor C2 and earth is an impedance Z whose ends are denoted by G and H, the voltage at the terminals of the capacitor C2 being taken between points M and G.

The input E2 of amplifier A1 is connected to point G by a conductor 40. The input E1 of amplifier A1 is connected to point M by a line 42 by way of an amplifier A2 and a circuit breaker switch L32 disposed in the connection between terminal M and the input resistor R of A2. Thus, the voltage at the terminals M and G of the capacitor C2 of the capacitive divider, which voltage is indicated by $v_e$ as in FIG. 1, is normally applied to the inputs of the amplifier A1, when the switch L32 is closed. The amplifier which has a high impedance converts the signal $v_e$ into an input signal of the primary side of the magnetic transformer T.

Besides the input resistor R2, the amplifier A2 also comprises an operational amplifier P2 having one input connected to the output F2 of the resistor R2 and having the other input connected at point 44 to the line 40, an output S2 for P2 on line 42, and a negative feedback resistor R'2 connected between points F2 and S2.

The impedance Z between terminals G and H is typically a resistor (or a current transformer) which has continuously passing therethrough an alternating current which produces at its terminals a voltage $v_i$ which is representative of that current.

The voltage $v_i$ is applied to an amplifier A3 which is similar in construction to the amplifier A2 and which comprises an input resistor R3 having one end connected to H, and operational amplifier P3 having one input connected to the other end F3 of the resistor R3 and having its other input connected at terminal 44 to line 40, the output of amplifier P3 being denoted by S3, and a negative feedback resistor R'3 connected between F3 and S3. The signal at the output S3 of the amplifier A3 is applied to a rectifying and filtering circuit 50 which on the one hand provides for full wave rectification of the signal and which on the other hand applies a slight filtering action to the signal which has thus been rectified, so as to produce an output voltage $v_2$ between the output 52 of the rectifier-filter circuit (RF) 50 and the reference line 40, the form of the output voltage being illustrated for example in the wave form diagrams in FIGS. 3 and 4. The signal $v_2$ is influenced by the peak value of the input signal $v_i$ which is representative of the current and tends to cover the upper part of the rectified wave (the latter is shown in broken line in FIGS. 3 and 4).

The voltage signal at output S2 of amplifier A2 is also applied to a rectifying and filtering circuit (RF) 60 which provides for full wave rectification and a slight filtering action in order to produce at its output 62 a signal of voltage $v_1$ with respect to the voltage of the reference line 40, which is shown in the wave form diagrams in FIGS. 3 and 4. The impedance Z selected for detecting the current in the embodiment described being a resistor, it will be noted that in both cases illustrated and described, the signals after full wave rectification but before filtering (shown in broken lines), as indicated at $v_1$ and $v_2$, are in phase quadrature.

The outputs 52 and 62 of the circuits 50 and 60 are respectively connected to the inputs 65 and 66 of a comparator 68 whose output 70 feeds the coil of a relay L1 whose other end is connected at point 72 to the reference line 40. The relay L1 controls closure of a switch L11 which is normally open when the relay L1 is not energised. The relay switch L11 itself feeds the coil of a relay L3 which, when energised, causes closure of the switch L32 for controlling the input of the amplifier A2, as has been described hereinbefore. The coil of the relay L3 is supplied by a supply source $-V$, $+V$ to which it may be connected either by closure of the switch L11 when the relay L1 is energised or by closure of two switches L21 and L31 disposed in series on a line parallel to the switch L11. The switches L31 and L21 are actuated by relays and are normally in the open position when the relays are not energised. The switch L31 is actuated by the relay L3, thus acting as a self-supply means for the latter when the relay L3 has been previously energised, for example when a voltage appears in relay L1, with accompanying closure of the switch L11.

The output 52 of the rectification and filtering circuit 50 is also connected to an input 75 of a comparator 78 whose other input 76 is supplied by means of a potentiometer 80 which provides it with a control reference voltage $v_{20}$. The output 82 of the comparator is applied to the coil of a relay L2 whose other end is connected to the terminal 72 of the reference line 40. When the relay L2 is energised, it causes closure of the switch L21 in series with the above-mentioned self-supply switch L31.

The basic principle of operation of the circuit whose structure has just been described with reference to FIG. 2 is as follows. Under continuous operating conditions, that is to say, when a high alternating voltage is established between line Lo and earth To, the alternating voltage $v_e$ taken off at the terminals of capacitor C2 of the divider is applied to the inputs E1 and E2 of the high-impedance amplifier A1, by virtue of closure of the switch L33 making a connection between the terminal M and the input E1 by way of the amplifier A2. The parameters of the amplifiers A2 and A3 are defined for that purpose, in dependence on the nominal amplitudes of the voltages $v_e$ and $v_i$, so that the signal at the input 65 of the comparator 68 is always higher than the signal operating at its input 66 ($v_2 > v_1$), whereby the output level of the comparator 68 is insufficient to energise the relay L1. The result of this is that the switch L11 is open and the relay L3 is not energised. The switch L21 remains in the open position, the relay L2 not being energised by the comparator 78 while the voltage $v_2$ remains higher than the threshold voltage $v_{20}$ fixed by the potentiometer 80.

This situation, under continuous operating conditions, is shown for example by the wave form diagram of FIG. 3, up to the moment T1, during which period the parameters $v_e$, $v_{el}$ (the output voltage of switch L32), $v_1$ and $v_2$ are periodic. FIG. 3 also shows the positions of the switches L11, L32, L31 and L21, the open position of a switch being represented by a zero logic state while the closed position (this being the case in respect of switch L32 under continuous operating conditions) is represented by logic state 1.

It will be assumed that, at moment T1, the line supply voltage is abruptly interrupted at the moment that it reached its peak value, which results in a continuous signal $v_e$ appearing at the terminals of capacitor C2, as from moment T1. From that moment, the signal $v_1$ assumes a continuous value which it maintains until moment T2. The current passing through the impedance Z becomes zero at moment T1 as a result of the interruption in the supply of the line, and the signal $v_2$ begins to fall progressively by virtue of the filtering action performed by the circuit 50. At time T2, the amplitude of the signal $v_2$ becomes lower than the constant amplitude attained by the signal $v_1$ so that the relationship between the amplitude of the inputs 65 and 66 of the comparator reverses ($v_2 > v_1$), giving rise to a control signal at the output 70 of the comparator, which triggers the relay L1. Energisation of the relay L1 causes energisation of the relay L3 and corresponding opening of the switch L32, thereby interrupting the connection between the terminal M and the amplifier A2 (see signal $v_{el}$ in FIG. 3, which falls back to 0 at moment T2). From that moment, the capacitor C2 is disconnected from the amplifier A1 and is unable to lose its charge, except possibly by way of very low leakage currents. This provides the advantage:

on the one hand, of not transmitting continuous voltage through the amplifier A1 from time T2; this can be sufficiently close to T1 to avoid any danger of transformer saturation during the period T1–T2;

on the other hand, of not discharging C2 and thus having a capacitive divider wherein the charges have not been changed when the voltage is re-applied.

The disappearance of the supply voltage at the input of amplifier A1 results, as from time T2, in a fall in the signal $v_1$ applied to the comparator 68. In order to prevent the switch L32 from closing again at an inopportune time, the comparator 78 comes into action. The comparator 78 detects the moment at which the signal $v_2$ corresponding to the voltage $v_1$ (current signal) falls below the value of voltage $v_{20}$, which, at moment T3, triggers the appearance of a signal at output 82 of the comparator 78 and accompanying energisation of the relay L2, with closure of the switch L21. A second line for supplying the relay L3 is thus established by way of the switches L21 and L31 before the first line controlled by switch 11 opens, possibly at a time T4, as shown in FIG. 3. Time T4 corresponds to the moment at which the two voltage $v_1$ and $v_2$ have fallen virtually to zero, the comparator 68 then ceasing to supply a signal for actuating L1.

When voltage is re-applied to the circuit, operation thereof is very simple. As soon as the alternating supply voltage re appears between points Lo and To, the resulting current signal $v_i$ is amplified by the amplifier A3 and results in an output voltage $v_2$ at the input 75 of the comparator 78, which voltage exceeds the control reference voltage $v_{20}$, so that the supply to the relay L2 is cut off. This triggers opening of the switch L21 and de-energisation of the switch L3. The switch L32 closes again and thus re-makes the connection between the output amplifier A1 and the terminal M of capacitor C2. The circuit is thus returned to the condition which characterises continuous operating conditions, as described above.

In summary, for a primary supply voltage of frequency $\omega/2\pi$ and amplitude Vp, to which there corresponds, under continuous operating conditions, a secondary voltage at the same frequency and of the same amplitude, $V_e$, the equation may be written as follows:

$$V_e = V_p \times C1/(C1+C2) \tag{1}$$

moreover, the amplitude of current I flowing in the divider and in particular through the impedance Z may be expressed in the form:

$$I = C\omega V_p \text{ with } C = C1\ C2/(C1+C2)$$

which, in consideration of equation (1) can be written as:

$$I = C2\omega V_e \tag{2}$$

which relationship is verified as long as the capacitive divider is supplied with alternating voltage.

If, following an interruption in the supply voltage, the voltage $v_e$ at the terminals of C2 assumes a constant value, the current through the divider falls to zero.

In order to detect this situation, two pieces of data can then be constantly compared, one $v_2$ being directly dependent on the amplitude of the current and the other $v_1$ being dependent on the voltage, the data linked to the current $v_2$ normally being higher than that linked to the voltage $v_1$.

As soon as the data $v_2$ corresponding to the current fall below the value of $v_1$ which correspond to the voltage, the product of the comparison operation is used to break the connection between the capacitor C2 and the inductive load formed by the transformer T at the output of the electronic amplifier, and thus to avoid saturation thereof. As has been shown hereinbefore, it is moreover preferable to break that connection upstream of the electronic amplifier rather than downstream thereof because in that way it is possible to prevent virtually any discharge of the capacitor C2 and thus change in the charge levels on capacitors C1 and C2, until voltage is re-applied.

The choice of the value of the control voltage $v_{20}$ is governed by the following considerations: for a capacitive voltage transformer as described by way of example with reference to FIG. 2, in a very high voltage network, of the type wherein the nominal voltage Un is 220 kvolts or 400 kV, the real voltage present on the network may vary for example between 0.8 and 1.2 times the nominal value. Consequently, the resulting current undergoes comparable variations in amplitude, with respect to its nominal value In. In addition, the frequency of the networks in question is 50 Hz but, depending on the conditions of use, it may range between 45 and 55 Hz.

Consequently, with the foregoing hypotheses, the minimum observable current when voltage is re-applied to a line which has been previously disconnected will be encountered when the real voltage of the network is equal to 80% of the nominal voltage and when the frequency is only 45 Hz. This means that the minimum value of the current capable of passing through the impedance Z when voltage is re-applied is about 70% of its nominal value, which provides the maximum value in regard to the choice of voltage $v_{20}$.

Account must also be taken of the voltage induced by the adjacent lines on the interrupted line Lo. In fact, a high voltage line may be likened to a capacitor and, when it is isolated by opening thereof at the two ends and charged for example at the peak value of the network voltage, it may receive, superimposed on the continuous voltage, a periodic voltage which is induced by the other phases which still have alternating voltage applied thereto. This is the situation illustrated in FIG. 4. The maximum amplitude of the induced voltage may reach 40% of the nominal amplitude Un and, under these conditions, the current through Z does not fall to zero but falls to an amplitude of 40% of In (FIG. 4). The threshold $v_{20}$ must therefore be higher than the corresponding amplitude of $v_2$. Voltage $v_{20}$ can therefore be selected at a value between 0.4 and 0.7 times the value of $v_2$ corresponding to In.

In practice, the times required for opening of the switch L32 after the supply voltage is interrupted and for closing the switch when the voltage is re-applied may be of the order of a few milliseconds.

It will be noted that the relays L1 and L2 and their associated switches may be in the form of semiconductor-type toggle switches. A relay-actuated mechanical switch could be preferred however, for the switch L32 and its actuating means L3, by virtue of its good dielectric resistance to high-frequency over-voltages which are liable to appear at the terminals of C2 in the operations of connecting and disconnecting the line Lo.

It is also in respect of high-frequency over-voltage phenomena that precautions are taken to protect the impedance Z, for example connecting a spark arrester to the terminals of the primary of a current transformer for receiving the current signal.

I claim:

1. A voltage detection means for a capacitive voltage divider which comprises a first and a second capacitor in series intended to be connected between a high voltage line and a means at reference potential, for the purposes of supplying an inductive load, comprising:

means for making a high-impedance connection between two points of the capacitive divider, on respective sides of said second capacitor, and said inductive load, to supply to said load a signal which depends on the voltage at the terminals of the second capacitor;

means for producing a current signal depending on the current passing through the capacitive divider;

means for forming a control signal depending on said current signal and a voltage at the terminals of a capacitive portion of said divider; and means for modifying said high-impedance connection in response to said control signal when a predetermined relationship is established between said current and said voltage.

2. A means according to claim 1 wherein said means for modifying the connection are so arranged as to interrupt said high-impedance connection in response to said control signal.

3. A means according to one of claim 2 wherein said relationship characterises the establishment of a continuous voltage at the terminals of said capacitive portion while said current falls to a lower value than a threshold value which is lower than the nominal current through the divider.

4. A means according to claim 3 wherein the means for producing a current signal comprise an impedance which is not purely capacitive in series with the first and second capacitors and means for taking off the voltage at the terminals of said impedance.

5. A means according to claim 4 wherein said impedance is a current transformer or a resistor.

6. A means according to one of claims 4 or 5 wherein said impedance is intended to be connected between the second capacitor and the reference means.

7. A means according to claims 1 or 2 wherein the means for forming the control signal comprise means for producing a voltage signal depending on the voltage at the terminals of a capacitive portion of the divider in response to the voltage at the terminals of the second capacitor.

8. A means according to claim 7 wherein the means for forming the control signal further comprise means for comparing the current signal and said voltage signal to provide said control signal when an alternating supply voltage of the capacitive divider is cut at a moment at which its instantaneous value is not zero.

9. A means according to claims 1 or 2 and further comprising means for detecting that the current signal obeys a predetermined condition for causing the modification of said high-impedance connection to be maintained.

10. A means according to claim 9 wherein said detection means also control the restoration of said connection to its initial condition when said current-dependent signal ceases to obey said condition.

11. A means for taking off voltage on a capacitive divider which comprises a first and a second capacitor intended to be connected in series between a terminal which is under voltage and a means at reference potential, for the purposes of supplying an output load, comprising:

means for making a high-impedance connection between two points of the divider on respective sides of the second capacitor, on the one hand, and said load, on the other hand, in order to supply to said load a signal depending on the voltage at the terminals of the second capacitor;

means for detecting the disappearance of the alternating component of the supply voltage for said capacitive divider; and means for interrupting said high impedance connection in response to detection by said detection means for the disappearance of the alternating component of the supply-voltage of the capacitive divider.

* * * * *